United States Patent [19]

Holczer et al.

[11] Patent Number: 5,619,139
[45] Date of Patent: Apr. 8, 1997

[54] MAGNETIC RESONANCE METHOD AND APPARATUS FOR DETECTING AN ATOMIC STRUCTURE OF A SAMPLE ALONG A SURFACE THEREOF

[75] Inventors: Karoly Holczer, Los Angeles, Calif.; Dieter Schmalbein, Marxzell; Peter Hoefer, Karlsruhe, both of Germany

[73] Assignee: Bruker Analytische Messtechnik GmbH, Rheinstetten-Forchheim, Germany

[21] Appl. No.: 393,121

[22] Filed: Feb. 21, 1995

[51] Int. Cl.$^6$ ........................................... G01R 33/20
[52] U.S. Cl. ........................................... 324/318; 324/300
[58] Field of Search ........................................... 324/300, 318, 324/322, 316, 317

[56] References Cited

U.S. PATENT DOCUMENTS

| | | | |
|---|---|---|---|
| 5,166,615 | 11/1992 | Sidles | 324/307 |
| 5,266,896 | 11/1993 | Rugar et al. | 324/300 |
| 5,319,977 | 6/1994 | Quate et al. | 73/606 |
| 5,410,910 | 5/1995 | Somlyo et al. | 73/105 |

FOREIGN PATENT DOCUMENTS 0551814  7/1993  European Pat. Off. .

OTHER PUBLICATIONS

Zuger, "First images from a magnetic resonance force microscope" Applied Physics Letters, vol. 63, No. 18, pp. 2496–2498 (Nov. 1993).

Ruger et al, "A mechanical detection of magnetic resonance", Nature vol. 360, No. 6404 pp. 563–566, (Dec. 1992).

Binning et al., "Surface Studies by Scanning Tunneling Microscopy", Physical Review Letters, vol. 49, No. 1, The American Physical Society (5 Jul. 1982), pp. 56–61.

Binning et al., "7×7 Reconstruction on Si(III) Resolved in Real Space", Physical Review Letters, vol. 50, No. 2, The American Physical Society (10 Jan. 1983), pp. 120–123.

Binning et al., "Atomic Force Microscope", Physical Review Letters, vol. 56, No. 9, The American Physical Society (3 Mar.1986), pp. 930–933.

Manassen et al., "Direct Observation of the Precession of Individual Paramagnetic Spins on Oxidized Silicon Surfaces", Physical Review Letters, vol. 62, No. 21, The American Physical Society (22 May 1989), pp. 2531–2534.

Wiesendanger et al., "Observation of Vacuum Tunneling of Spin–Polarized Electrons with the Scanning Tunneling Microscope", Physical Review Letters, vol. 65, No. 2, The American Physical Society (9 Jul. 1990), pp. 247–250.

(List continued on next page.)

Primary Examiner—Louis M. Arana
Assistant Examiner—Raymond Y. Mah
Attorney, Agent, or Firm—Claude A.S. Hamrick

[57] ABSTRACT

A method and an apparatus are disclosed for detecting an atomic structure of a sample along a surface thereof. The method comprises arranging the sample in a constant magnetic field ($B_0$) of predetermined field strength and high homogeneity and irradiating a high-frequency magnetic field ($B_1$) of a predetermined frequency on the sample, wherein the fields ($B_0$) and ($B_1$) are oriented perpendicularly to each other. The method further comprises providing a force-sensitive sensor having a paramagnetic tip comprising a paramagnetic material. The sensor is placed in close vicinity to the sample such that the paramagnetic tip is in atomic interaction with the sample surface which means that the distance between the tip and the surface is in the order of between 1 and 10 Å. The predetermined field strength and the predetermined frequency are set such that electron paramagnetic resonance (EPR) is excited within the tip paramagnetic material. The paramagnetic tip is then displaced parallel to the sample surface for mapping predetermined points on the sample surface. During displacing the tip the force exerted on the tip by a local inhomogeneous magnetic field ($B_{loc}$) caused by atomic magnetic moments ($m_{e,k}$) of the sample is measured.

57 Claims, 7 Drawing Sheets

OTHER PUBLICATIONS

Sidles, J.A., "Noninductive detection of single-proton magnetic resonance", *Applied Physical Letters*, vol. 58, No. 24, The American Institute of Physics (17 Jun. 1991), pp. 2854–2856.

Sidles, J.A., "Folded Stern–Gerlach Experiment as a Means for Detecting Nuclear Magnetic Resonance in Individual Nuclei", *Physical Review Letters*, vol. 68, No. 8, The American Physical Society (24 Feb. 1992), pp. 1124–1127.

Rugar et al., "Mechanical detection of magnetic resonance", *Nature*, vol. 360 (10 Dec. 1992), pp. 563–566.

Züger et al., "First images from a magnetic resonance force microscope", *Applied Physical Letters*, vol. 63, No. 18, American Institute of Physics (1 Nov. 1993), pp. 2496–2498.

MAGNETIC RESONANCE METHOD AND APPARATUS FOR DETECTING AN ATOMIC STRUCTURE OF A SAMPLE ALONG A SURFACE THEREOF

BACKGROUND OF THE INVENTION

The invention relates to a method and an apparatus for detecting an atomic structure by means of magnetic resonance of a sample along a surface thereof. Such apparatus could be identified as a Scanning Electron Paramagnetic Resonance Microscope (SEPRM). However, the invention is not only adapted for studying surface structures, moreover, it is an atomic scale analytical tool.

In particular, the invention relates to a magnetic resonance method for detecting an atomic structure of a sample along a surface thereof. More specifically, the invention relates to a method by which a force is measured acting on a mechanical force-sensitive sensor having a tip, the tip being brought into atomic interaction with the sample surface with the sample and the tip being displaced relatively to each other in directions parallel to the sample surface and a deflection of the force-sensitive sensor being detected at predetermined points of the sample surface.

The invention, further, relates to a magnetic resonance apparatus for detecting an atomic structure of a sample along a surface thereof, in particular for carrying out the aforespecified method. Still more specifically, the invention relates to such an apparatus having a probe head and a force-sensitive sensor being provided with a tip. Further, means are provided for contacting the sample surface with the tip and for displacing the sample relative to the tip in directions parallel to the sample surface. Further, means are provided for detecting a deflection of the force-sensitive sensor.

DISCUSSION OF RELATED ART

In the prior art, various types of so-called scanning probe microscopes have been disclosed. The first scanning probe microscope was the Scanning Tunneling Microscope (STM) (cf. G. Binnig et al. "Surface Studies by Scanning Tunneling Microscopy", Phys. Rev. Lett. 49, 57, (1982) and "7×7 Reconstruction on Si (111) Resolved in Real Space", Phys Rev Lett 50, 120, (1983). Later on, Atomic Force Microscopes (AFM) were disclosed (cf. G. Binnig et al. "Atomic Force Microscopy", Phys. Rev. Lett. 56, 930, (1986)), which were more general and proliferated into many sub-branches using different detection modes for different problems, called: "Magnetic Force Microscopy" (MFM), Friction Force (lateral force) Microscopy, recently even Magnetic Resonance Force Microscopy (MRFM).

The underlying common element of these Scanning Probe Microscopes is the use of a local sensor in combination with piezoelectric displacers providing sub-Ångstrom precision displacements in three dimensions, and a feed-back loop to maintain a constant interaction between the sensor and the sample (regulating the z-direction) while the sample is displaced in the x-y plane relative to the sensor. The resulting topographic image is usually the z-position as a function of x and y at constant force or the corresponding force at constant z-position.

Scanning Tunneling Microscopes (STM) use conducting tips as sensors and the distance is regulated keeping a constant tunneling current (typically of the order of 1 nA) between the tip and the sample. The tip does not touch the sample, in general. When used as spatially resolved tunneling spectroscopy (non-atomic resolution), STM provides bulk information about the material since the tunneling current is proportional with the conduction electron density.

The main success of STM consists in that it is relatively easy to achieve atomic resolution with it. This is precisely because of the short-range interaction detected since the tunneling current falls off exponentially in atomic (Ångstrom) scale, allowing to differentiate with resolution better than atomic distances. The handicap of STM is that it needs a current, though very small, so that the sample studied may not be an insulator. A practical inconvenience of STM is that one has to deal with vacuum tunneling and the surface cleanness is extremely critical because it influences the stability of the tunneling current. Therefore, nearly all STM experiments require an expensive multi-chamber UHV installation.

The extraordinary sensitivity of the STM allows to observe modulation of tunneling current attributed to the Larmor precession of a single electron spin on oxidized Si surface (Y. Manassen et al., "Direct Observation of the Precession of Individual Paramagnetic Spins on Oxidized Silicon Surfaces", Phys. Rev. Lett. 62, 2531 (1989)). This observation, however, has not been exploited in practice, as the nature of the interaction of the localized spin with the tunneling current, leading to the observed modulation is completely unknown, and it might be specific to the given material and experiment. The quantitative analysis was also hindered by the unknown nature of the mechanism. Only an external static field has been applied in this experiment.

Spin-polarized tunneling has also been reported, using a ferromagnetic tip ($CrO_2$) to study antiferromagnetic atomic terraces (Cr) (R. Wiesender et al., "Observation of Vacuum Tunneling of Spin-Polarized Electrons with the Scanning Tunneling Microscope", Phys Rev Lett 65, 247, (1990)). The mechanism, how magnetism influences the tunneling current, however, stays unidentified.

Atomic Force Microscopes (AFM) may be used on a more general scale. The phenomenon underlying this technology is based on interactions of varying nature and the strength, depending on the sample studied. These interactions comprise hard core repulsion and Van der Waals interactions for covalent materials. Electrostatic interactions for ionic crystals are studied with ionic tips and magnetic interactions are studied if the tip is ferromagnetic, etc. In general, these forces are not enough short range to insure atomic resolution. Each case and each material need special efforts and techniques to achieve highest resolution. Typically, these forces change only an order of magnitude in the entire range of useful distances (2–10 Å), while the tunneling current changes three orders of magnitude with a single atomic step (2–5 Å). AFM became popular in spite of these difficulties, because of the more general use and because UHV environment is avoidable (most of the experiments are made in ambient conditions or moderate vacuum) and atomic resolution has been achieved on hard materials such as graphite and on ionic salts (due to the strong contrast of the alternate charged atoms).

Atomic force-microscopes (AFM) essentially consist of a mechanical force-sensitive sensor being designed as an elongate elastic arm attached to a base at one end thereof and being designated in the art as "cantilever". The cantilever is provided with an extremely pointed tip.

By means of the tip it is possible to sense attracting and repelling forces, respectively, in a distance of a few Ångstroms from a surface of a sample. Such static atomic forces may, for example, be the attracting Van-der-Waals force, electromagnetic forces, or the repelling force being generated, when two atoms contact each other like two hard spheres. Furthermore, static magnetic forces existing in the vicinity of the surface of ferromagnetic samples may be detected with such a force-sensitive sensor. The force-sensitive sensors mentioned before have a sensitivity for forces down to $10^{-18}$ N.

A deflection of the force-sensitive sensor being caused by atomic forces and amounting only to Ångstroms may best be detected by optical means. For that purpose a beam of laser light is directed to and reflected from the force-sensitive sensor, the reflected beam impinging on a detector. The deflection of the force-sensitive sensor thus, results in a deflection of the laser beam which may easily be measured.

By displacing the tip along the surface (x, y) of the sample in various distances, for example between 1 and 10 Å, or in the µm range an electronic data processing of the z-height at constant force yields a topographic three-dimensional picture of the surface structure. The sampling operation of an AFM may be illustrated with the example of the tip of a classical record player needle following the grooves of a record.

By means of an AFM surface structures may be made visible within a range from micrometers down to the atomic scale, i.e. even single atoms near the surface may be detected. In a computer generated diagram of z at constant force as a function of x and y, generated during the scanning or mapping of a surface the atoms appear as bright semispheres in front of a dark background and may be seen three-dimensionally. However, it would also be possible to generate a force diagram at constant height z.

Furthermore, although an AFM allows to detect single atoms, it does not allow to distinguish between different kinds of atoms. However, in poly-atomic samples one would be interested in gathering information about the question which is the kind of detected atoms and what the relative position is between the various atoms with respect to each other.

Another scanning probe microscope is the magnetic force microscope (MFM). Due to the nature of the magnetic interactions, force can be created only between a field gradient and a magnetic dipole. The same holds true for two dipoles, as the field gradient can always be viewed as having been generated by another dipole. Ferromagnetic tips are used with MFM as magnetic dipoles, and the field gradients originated from the domain structure or walls of different magnetic medias are studied. A resolution of the order of 100 nm may be achieved. An atomic resolution is not even aimed for with MFM.

The gradient of the magnetic field is detected as a force acting on the macroscopic magnetic dipole moment of the tip. The tip is usually lifted several hundred Å from the surface, to avoid the influence of other forces.

As both the field gradient studied and the dipole of the tip are static, the cantilever is mechanically vibrated to increase the sensitivity of the detection. The force derivative is detected, or, with other words, the advantages of an AC (synchronous) detection are used in combination with the high quality factor of the mechanical resonance of the cantilever.

Further, it is known to use nuclear magnetic resonance (NMR) or electron spin resonance (ESR) (also identified as paramagnetic resonance (EPR)), respectively, for identifying atoms and electrons, respectively by quantitatively measuring their magnetic moments, in particular their g-factors. With NMR or EPR, respectively, a sample is investigated with respect to its magnetic properties within magnetic fields being oriented perpendicularly to each other. By doing so one does not only detect the sample surface, instead NMR or EPR, respectively, are also excited in deeper sample layers. However, conventional NMR or EPR, respectively, does not allow high resolution localization of detected magnetic moments in the atomic scale.

Generally, the various techniques of magnetic resonance comprise placing the spin in a static, high magnetic field while applying a perpendicular alternating magnetic field with frequencies in the vicinity of the Larmor frequency determined by the static field. This allows to control the spin orientation via techniques generally known as slow adiabatic passage, transient nutation spin inversion by $\pi$ (180°) pulses, etc.

The suggested magnetic resonance force microscopes (MRFM) comprise a sample attached to a cantilever and placed in a static field gradient exerting an oscillating force on the cantilever as a result of the free Larmor precession of the magnetic moments of the individual nuclear and electron spins (J. A. Sidles et al., "Folded Stern Gerlach experiment as a means of detecting magnetic resonance in individual nuclei", Phys Rev Lett. 68 1124–1127, (1992) and "Noninductive detection of single-proton magnetic resonance", Appl. Phys. Lett. 58, 2854–2856, (1991)).

As the field is different in the different points of the space, these Larmor precessions are of different frequencies as a function of the spin location. Thus, it was suggested to use this method to image individual spins and atoms as it is usual in magnetic resonance imaging. Further experiments (Rugar et al., "Mechanical detection of magnetic resonance", Nature 360, 563–566, (1992), and "First images from a magnetic resonance force microscope", Appl. Phys. Lett. 63, 2496–2498, (1993)) used the following configuration:

The sample is attached to a high quality factor cantilever. A small ferromagnetic particle is placed in the vicinity and provides the field gradient. An external constant field and an RF coil create a perpendicularly oscillating field. The resonance frequency is much higher as compared to the cantilever mechanical resonance frequency (natural frequency). Therefore, these experiments have used the means of magnetic resonance to oscillate the magnetic moment of the sample at a desired frequency, tuned to the mechanical resonance frequency of the cantilever. The oscillating moment, being in the static field gradient of the ferromagnetic particle, results in an oscillating force, driving the cantilever to oscillate. The amplitude of the cantilever oscillation is detected.

Rugar also used a sample consisting of DPPH (diphenyl-picryl-hydracyl) and being attached to a mechanical force-sensitive sensor. An inhomogeneous magnetic field is generated in the area of the sample by means of a conically shaped permanent magnet. Due to the gradient of the inhomogeneous magnetic field a magnetic force acts on the sample, causing a deflection of the force-sensitive sensor. Concurrently, EPR is excited within the DPPH sample by simultaneously irradiating a high-frequency magnetic field. Due to the inhomogeneity of the magnetic field generated by the permanent magnet, the EPR resonance condition is only met along a certain surface within the sample. Insofar, this method corresponds to classical MR-tomography obtaining a localization of magnetic resonance (MR) by imposing gradient fields.

In the prior art method the force-sensitive sensor is, further, excited to oscillate at its natural frequency by modulating the inhomogeneous magnetic field with a modulating magnetic field of low amplitude. The resonant deflection of the force-sensitive sensor is detected by optical means. The values of the so-detected magnetic force along the sample surface are fed into a memory for various distances between the sample and the permanent magnet for generating localized spin density pictures by means of electronic data processing.

By doing so a resolution in the order of between 1 and 20 μm is obtained. This unsatisfying resolution depends on the weak field gradient of the inhomogeneous magnetic field generated by the permanent magnet. For achieving a resolution in the order of Ångstroms a field gradient in the order of about 100 Gauss/Å is required. In the Rugar experiment, however, the field gradient was only about 5 Gauss/μm. A strong magnetic field gradient in the atomic range, as described before, may be obtained with a ferromagnetic source of magnetic field only when the field source itself has atomic dimensions. For example, a ferromagnetic sphere having a diameter of about 300 Å would have to be manufactured for obtaining a field gradient of about 100 Gauss/Å in a distance of 50 Å from the sphere.

It is, therefore, an object underlying the invention to provide a method and an apparatus as mentioned at the outset which, on the one hand side, has the advantages of AFM, namely allowing high resolution topographical atomic determination of structures on sample surfaces but, on the other hand side, allowing to determine the identity of atoms, in particular of their atomic magnetic moments and the distribution of atomic magnetic moments within the sample by using magnetic resonance effects for particularly detecting single spins in the sample surface.

SUMMARY OF THE INVENTION

According to a first aspect of the invention, there is suggested a method for detecting an atomic structure of a sample along a surface thereof, the method comprising the steps of:

arranging said sample in a constant magnetic field $B_0$ of predetermined field strength and high homogeneity, said constant magnetic field $B_0$ having a first direction;

irradiating a first high-frequency magnetic field $B_1$ of a first predetermined frequency on said sample, said first high-frequency magnetic field $B_1$ having a second direction perpendicular to said first direction;

preferably irradiating a second high-frequency magnetic field $B_2$ of a second predetermined frequency on said sample, said second high-frequency magnetic field $B_2$ having a second direction perpendicular to said first direction, and setting said second pre-determined frequency such that magnetic resonance is excited within said sample surface;

providing a force-sensitive sensor having a paragraph magnetic tip comprising a paramagnetic spin at a terminal end of said paramagnetic tip, said spin being accessible for electron paramagnetic resonance (EPR) excitation;

placing said sensor in close vicinity to said sample such that said sensor tip is in atomic interaction with said sample surface;

setting said predetermined field strength and said predetermined frequency such that EPR is excited within said paramagnetic tip;

displacing said paramagnetic tip parallel to said sample surface for mapping predetermined points on said sample surface; and during said step of displacing measuring the force exerted on said paramagnetic tip by a local in-homogeneous magnetic field $B_{loc}$ caused by atomic magnetic moments $m_{e,k}$ of said sample.

Further, according to a second aspect of the invention, there is disclosed an apparatus for detecting an atomic structure of a sample along a surface thereof, the apparatus comprising:

means for arranging said sample in a constant magnetic field $B_0$ of predetermined field strength and high homogeneity, said constant magnetic field $B_0$ having a first direction;

means for irradiating a first high-frequency magnetic field $B_1$ of a first predetermined frequency on said sample, said first high-frequency magnetic field $B_1$ having a second direction perpendicular to said first direction;

preferably means for irradiating a second high-frequency magnetic field $B_2$ of a second predetermined frequency on said sample, said second high-frequency magnetic field $B_2$ having a second direction perpendicular to said first direction, and setting said second predetermined frequency such that magnetic resonance is excited within said sample surface;

means for providing a force-sensitive sensor having a paramagnetic tip comprising a paramagnetic spin at a terminal end of said paramagnetic tip, said spin being accessible for electron paramagnetic resonance (EPR) excitation;

means for placing said sensor in close vicinity to said sample such that said sensor tip is in atomic interaction with said sample surface;

means for setting said predetermined field strength and said predetermined frequency such that EPR is excited within said paramagnetic tip;

means for displacing said paramagnetic tip parallel to said sample surface for mapping predetermined points on said sample surface; and means for measuring the force exerted on said paramagnetic tip by a local inhomogeneous magnetic field $B_{loc}$ caused by atomic magnetic moments $m_{e,k}$ of said sample during said step of displacing.

The object underlying the invention is thus entirely achieved.

The fundamentally new idea of the present invention is to use the EPR of a spin located at the tip to measure atomic scale magnetic field gradients. The aim is to provide atomic scale analytical information beside the usual topographic information obtained by AFM.

The present invention places a special tip, having an electron spin on its far end, inside of a millimeter wave EPR resonant structure and, preferably, a broad band NMR probe. The aim is to detect any other spin in the sample in the Å scale vicinity of the tip spin through the mechanical force arising from their interaction.

This force is expected to be orders of magnitude smaller than the other forces of atomic origin acting on the tip. Subjecting these spins to various EPR and NMR excitations allows to control their relative orientation, i.e. a modulation of the minority force component at will. A large variety of synchronous detection schemes can be envisaged to separate and measure this minority force. This allows to identify (in the analytical, chemical sense) and precisely locate (in the structural sense) the unknown sample spin.

For the first time the advantages offered by an AFM, for example the excellent local resolution is combined with the advantages inherent to conventional NMR and EPR, respectively, namely their ability to identify atoms by means of their magnetic properties. The method and apparatus according to the present invention, therefore, provide localized data on the distribution of atoms within the sample surface as well as non-localized data of magnetic moments associated to atoms and, further, localized microscopic magnetic fields in the vicinity of the respective atoms may be detected with a resolution of the atomic scale.

The invention, therefore, distinguishes over the approach suggested by Rugar under several aspects. First, the sample is not attached to a force-sensitive sensor but, in contrast, the force-sensitive sensor itself is provided with a paramagnetic tip. Therefore, the force-sensitive sensor may be used for many subsequent and many different experiments. Furthermore, the inhomogeneous magnetic field is not externally generated by means of a permanent magnet, instead, the microscopic inhomogeneous magnetic field of every single atomic magnetic moment is used as a source of magnetic field gradients. The microscopic inhomogeneous magnetic fields, further, provide for the field gradients of several 100 Gauss/Å required for the high local resolution so that even single spins may be detected in the sample. Furthermore, the inhomogeneous magnetic field caused by the atomic moments may be varied by additional exciting NMR and EPR within the sample.

As explained before, the present invention uses forces originated from the interaction of the dipole moments of two spins; one situated at the far end of the tip, the other being on the surface of the sample under investigation. In this arrangement, the cantilever properties do not depend on the parameters of the sample under investigation (like the resonant frequency of the cantilever influenced by the mass of the sample). This can be viewed only as the interchange of sample and ferromagnetic particle in the MRFM approach of Sidles and Rugar cited above.

These two dipoles are placed to Å scale distance from each other producing the maximum gradient or maximum force on each other. As a tip spin or sensor spin an electron spin is chosen as being the one providing the largest accessible field gradient in the nature at the closest accessible distance as compared to any ferromagnetic particle, the largest gradient of which at the pole or on the surface is smaller. This means that from the field gradient originated from a single spin the strongest force will be exercised on the paramagnetic tip as defined in the present invention, resulting in the highest sensitivity possible.

A fundamental difference to the approach suggested by Rugar is that in the present invention none of the magnetic dipoles (field gradients) are static. Their relative orientation is fixed only by the high applied static magnetic field and the orientation of both can be manipulated independently by magnetic resonance means.

Magnetic resonance means, preferably EPR, are used first to modulate the orientation of spin located on the sensor tip. This results in an alternating force on the cantilever if the field gradient experienced by the tip spin is not zero, independently of the origin of the field gradient, thereby realizing the most sensitive local field gradient measurement possible on atomic scale.

Preferably, magnetic resonance means are used the second time to identify the source of the field gradient experienced by the cantilever tip. This is done by finding the resonance frequency in the NMR or in the EPR frequency range, and modulating the orientation of that specific sample spin. It is in this step that the magnetic moment in the sample is chemically identified.

Another advantage resides in the fact that EPR is excited within the tip. Due to the fact that the magnetic moments within the tip are detectors for magnetic forces acting from the inhomogeneous magnetic fields of the single atomic moments of the sample, the resonance properties of both, the tip spin and the sample spin, may be entirely used and their orientation with respect to each other may be controlled and modulated.

According to a preferred embodiment of the invention, the claimed method comprises further steps of irradiating a second high-frequency magnetic field $B_2$ of a second predetermined frequency on said sample, said second high-frequency magnetic field $B_2$ having a second direction perpendicular to said first direction, and setting said second predetermined frequency such that magnetic resonance is excited within said sample surface.

Preferably, in case of this preferred embodiment, the step of exciting magnetic resonance comprises exciting either nuclear magnetic resonance (NMR) or electron paramagnetic resonance (EPR).

These embodiments of the invention have the advantage that not only a topographig image of the surface under investigation may be generated; instead, a chemical identification of surface material is possible.

In a preferred embodiment of the invention, the static or constant magnetic field is set to be stronger than the inhomogeneous magnetic field created by the sample and the tip spins.

According to a further preferred embodiment of the inventive method the constant magnetic field is selected above 2 Tesla, preferably in the range between 2 and 4 Tesla.

These measures have the advantages that the magnetic moments within the tip and within the sample will preferably be oriented along the constant magnetic field.

According to another embodiment of the method the constant magnetic field is set to extend perpendicularly to the sample surface.

Considering that this is the orientation of maximum force between the sample and the tip, this orientation may be easily controlled.

It is further preferred when the paramagnetic material of the tip is selected different from the material constituting the sample.

As the materials distinguish with respect to their NMR and EPR properties, such that their magnetic resonance lines may be distinguished within the frequency spectrum, the NMR or EPR, respectively, may be selectively excited within the sample and within the tip, independently from each other.

The method according to the invention is carried out with an extremely high local resolution when the tip is designed with a terminal end having an isolated paramagnetic moment.

Due to the fact that a single paremagnetic moment at the terminal end of the paramagnetic tip does not or only weakly interact with other magnetic moments within the tip and, further, considering that such an isolated paramagnetic moment may be placed into very close vicinity to the sample surface, the force-sensitive detector is a point-shaped detector with respect to the detection of magnetic forces with the "point" having a dimension in the atomic scale and the magnetic moment having thus the smallest possible dimension.

It is preferred to detect the force at a distance of the tip from the sample surface in the order of between 1 and 10 Å.

With such a distance the local inhomogeneous magnetic fields of the single magnetic moments of the sample have a sufficient strength and the gradient of the inhomogeneous magnetic fields are sufficiently strong at such a distance for yielding a measurable force and a sufficient local resolution.

A particularly sensitive measurement may be made if a force-generated deflection of the force-sensitive sensor is detected by optical means.

In a preferred embodiment of the invention a laser beam is used being reflected from the force-sensitive sensor and impinging subsequently on a four-quadrant diode. The deflection of the force-sensitive sensor may be measured as a difference signal between an upper segment and a lower segment of the four-quadrant diode.

Optical measuring methods are preferred due to their extremely high precision. Due to the fact that a laser beam is reflected from the force-sensitive sensor and is then detected on a four-quadrant diode, the extremely small deflection on the force-sensitive sensor from its initial position, being of the order of 1 Å is optically amplified by means of a corresponding long optical path of the light beam.

As an alternative, the deflection caused by forces acting on the force-sensitive sensor may be detected by measuring a variation of electrical resistance within the force-sensitive sensor itself (F. J. Giessibl, Science 267, 68, (1995)).

According to a group of embodiments the constant magnetic field is adapted to be amplitude modulated with a modulation frequency in the range of between 10 and 100 kHz.

Applying a suitable frequency $B_1$, the magnetic moment on the tip is periodically inverted with the modulation frequency. Thereby, an oscillating force is generated exciting the mechanical force-sensitive sensor to oscillate. The oscillating force may result in an amplification of the force-sensitive sensor deflection and, hence, in an amplification of the measuring sensitivity.

According to an alternate group of embodiments the high frequency magnetic field is frequency modulated with a modulation frequency in the range of between 10 and 100 kHz.

According to a preferred variation of the last-mentioned embodiment the EPR resonance conditions are controlled by a modulating magnetic field being superimposed to the homogeneous constant magnetic field.

This measure has the advantage that the EPR resonance condition may be precisely controlled and set.

It is particularly preferred to select the modulation frequency to be equal to the natural or resonance frequency of the force-sensitive sensor.

If the force-sensitive sensor is excited to oscillate at its resonance or natural frequency, a particular high sensitivity of the measured signal is obtained.

Furthermore, it is preferred to synchronously detect a measured signal with a modulation frequency of the amplitude modulated constant magnetic field by using a lock-in amplifier.

When doing so, the sensitivity may be increased and the modulation frequency may be exactly tuned to the resonance frequency of the force-sensitive sensor.

According to another embodiment a measuring signal having the modulation frequency of the frequency modulated high-frequency magnetic field is synchronously detected in a first lock-in amplifier, a reference signal having the low-frequency modulation frequency of the constant magnetic field being synchronously detected in a second lock-in amplifier with an output signal of the first lock-in amplifier, the second lock-in amplifier having an output signal being processed as an error signal for fine adjusting the constant magnetic field and, thereby, EPR resonance conditions.

These measures result in another advantage because the measuring effect is amplified by tuning the modulation frequency to the resonance frequency of the force-sensitive sensor. Further, a fine tuning of the constant magnetic field takes place allowing to guarantee EPR conditions at any time.

According to another group of embodiments the force-sensitive sensor is mechanically excited to oscillate at its natural frequency, the high-frequency magnetic field being irradiated as a sequence of π-pulses synchronous with the sensor oscillations, a variation of the sensor natural frequency being detected along the sample surface.

When doing so, one takes advantage of the fact that the natural frequency of the force-sensitive sensor is linearly depending on the gradient of the inhomogeneous force caused by the magnetic field within which the tip is arranged.

Preferably, for distinguishing between nuclear moments and paramagnetic moments within the sample, additional further high-frequency magnetic fields are irradiated on the sample parallel to the high-frequency field for exciting nuclear magnetic resonance (NMR) and/or further paramagnetic resonance (EPR).

By doing so it is possible to investigate whether a detected magnetic moment of the sample is a nuclear or an electronic magnetic moment.

In particular, the magnetic moments of the sample may be quantitatively investigated.

According to another preferred embodiment of the invention the tip of the force-sensitive sensor is brought into interaction with the sample surface such that the sum of static atomic non-magnetic forces acting on the tip equals zero.

When doing so it is prevented on the one hand side that such atomic non-magnetic forces disrupt the detection of the magnetic force, and, on the other hand side the distance values at which the non-magnetic forces disappear allow to generate a topographic picture of the surface corresponding to those used with conventional AFMs.

Preferably, the distance between the tip of the force-sensitive sensor and the sample surface at which the sum of the static atomic non-magnetic moments equals zero is set and controlled by means of a DC signal from the four-quadrant diode.

BRIEF DESCRIPTION OF THE DRAWINGS

These and further advantages of the invention will come apparent from the subsequent description in connection with the attached drawing. However, it goes without saying that the afore-mentioned features as well as those described hereinafter may not only be used in the context as described but may also be used in other contexts, or alone without departing from the scope of the present invention.

In the drawings.

DETAILED DESCRIPTION OF THE PREFERRED EMBODIMENTS

Figure 1:
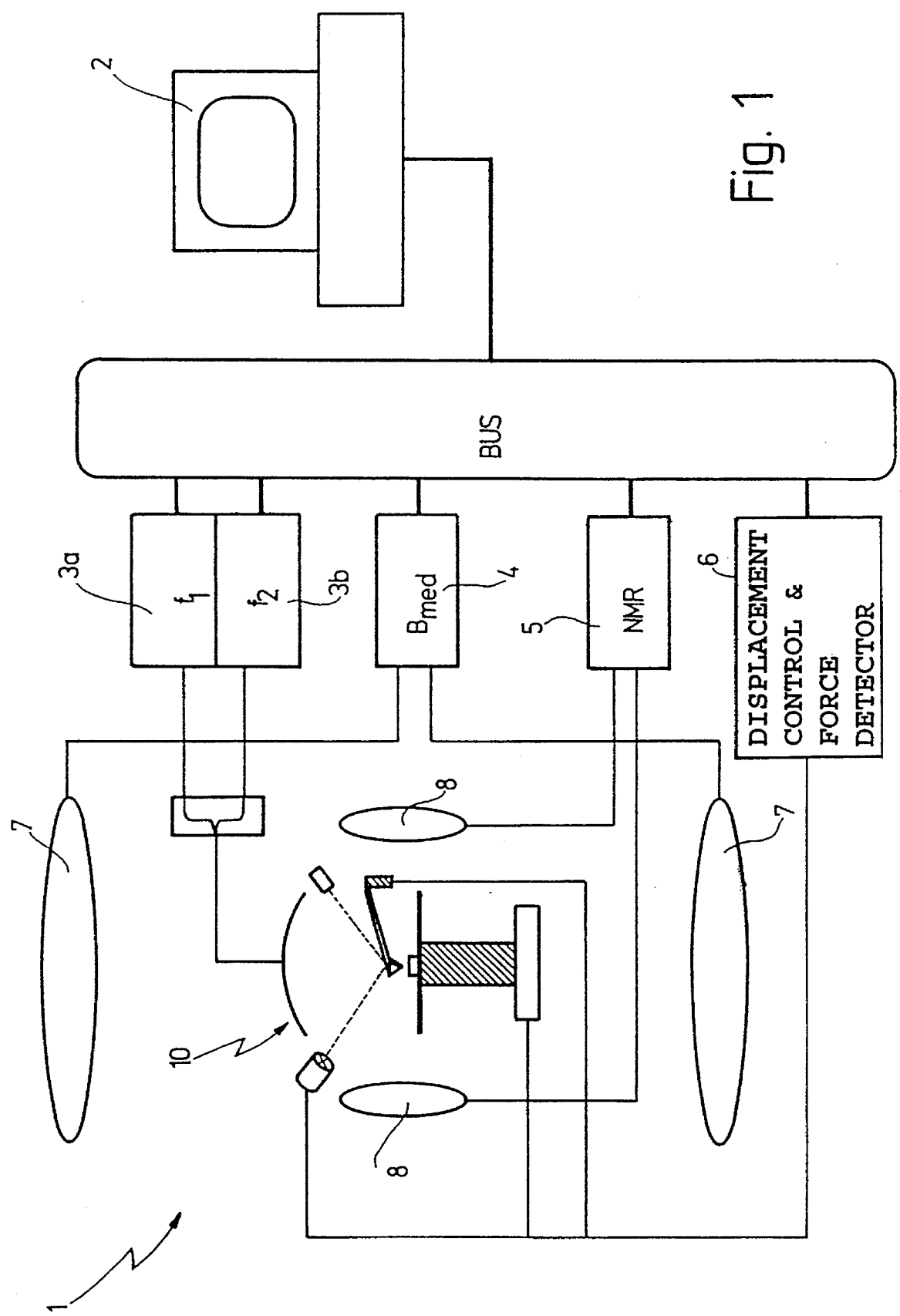
FIG. 1 shows a simplified block diagram of a scanning electron paramagnetic resonance microscope (SEPRM)

FIG. 1 shows an extremely simplified block diagram of a scanning electron paramagnetic resonance microscope (SEPRM) being designated by reference numeral 1.

SEPRM 1 comprises a systems control 2 cooperating via a common bus with a primary EPR excitation 3a and a secondary EPR excitation 3b. Further, a field modulation generator 4 is provided. A secondary NMR excitation 5 may also be provided. A displacement control and force detector are identified with reference numeral 6.

Modulation coils 7 are fed by field modulation generator 4. NMR coils 8, in turn, are fed by secondary NMR excitation 5.

SEPRM 1 uses a probe head 10 that will be described in more detail with respect to FIG. 2 hereinafter.

Figure 2:
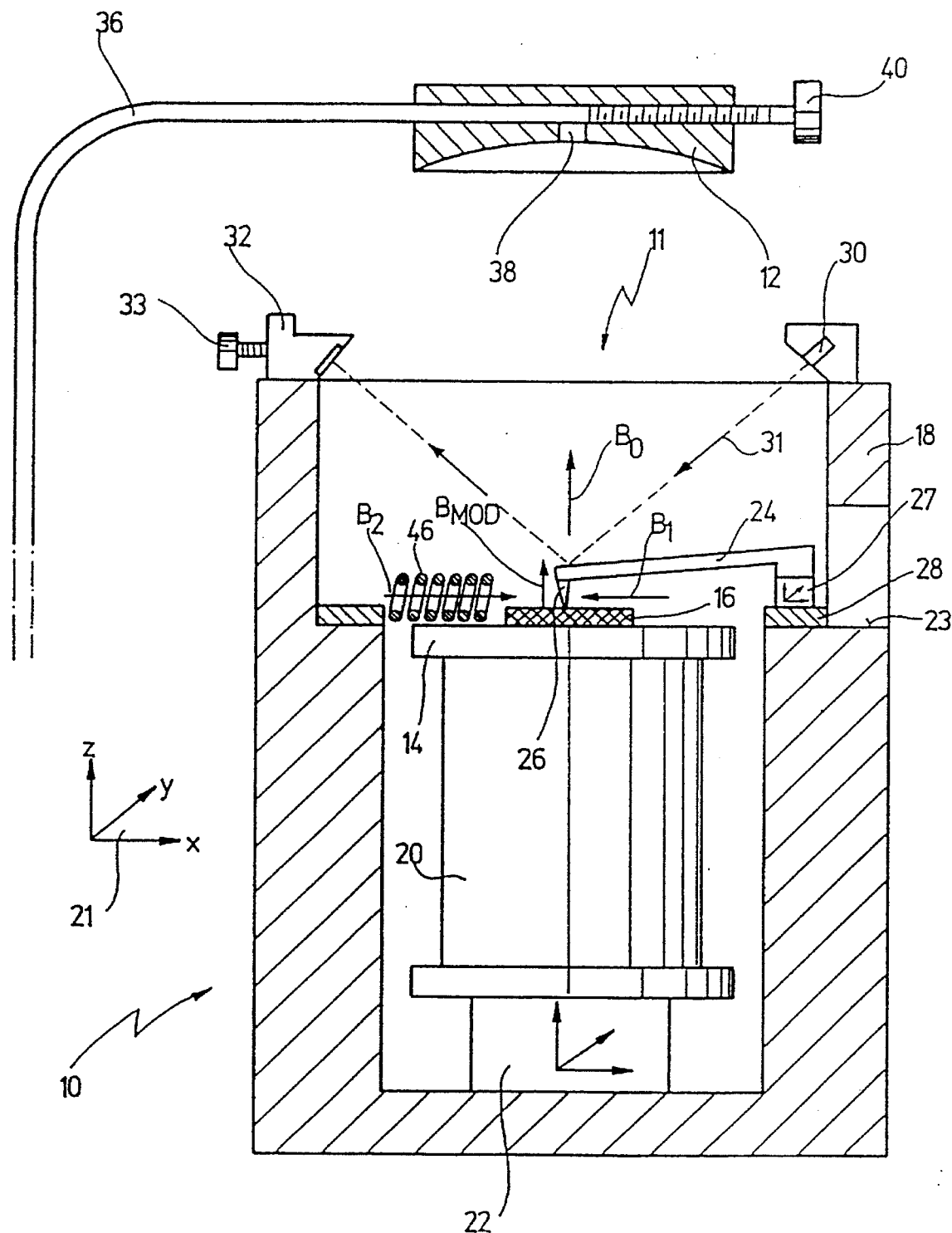
FIG. 2 shows a side elevational sectional view of a probe head as used in the microscope of FIG. 1 for carrying out the claimed method.

In FIG. 2, reference numeral as a whole indicates a probe head. Probe head 10 comprises a Fabry-Perot resonator 11 consisting of a spherical upper mirror 12 and a plane lower circular mirror 14. Spherical mirror 12, for example, has a radius of curvature of about 35 mm and a diameter of about 30 mm, whereas lower mirror 14 has a diameter of about 10 mm.

A sample 16 is arranged approximately in the center of lower mirror 14.

Resonator 11 is surrounded by a cylindrical housing 18 (for example made from aluminum). Housing 18 extends upwardly until upper mirror 12, however, is in no mechanical contact with either upper mirror 12 or lower mirror 14. Upper mirror 12 is arranged separately from fixed housing 18 to allow free adjustment of the distance between upper mirror 12 and lower mirror 14 and, hence, the resonance frequency of resonator 11.

Lower mirror 14 is attached to a piezo-electrical scanner 20 allowing a displacement of lower mirror 14 and, hence, of sample 16 as well in the plane of lower mirror 14 (x-y-plane) as well as in a direction (z) perpendicular thereto (x-y-z-coordinate system 21). Piezo-electrical scanner 20 is attached to a bottom of housing 18, such that it may be displaced by means of a mechanical course adjustment 22 in z- and in x-y-directions on a larger scale of about 1 mm.

The required electrical supply lines are not shown in FIG. 2.

A cantilever 24, i.e. an elongate free arm is attached as a mechanical force-sensitive sensor adjacent sample 16 on a piezo-electrical modulator 27. Modulator 27, in turn, is attached above lower mirror 14 on an annular plate 28 of housing 18 extending around lower mirror 14. Cantilever 24 is provided with a pointed tip having a paramagnetic material on its free end. The free end of cantilever 24 together with tip 26 may be deflected in the z-direction under the action of a force.

The properties of cantilever 24 together with tip 26 will be explained in more detail below.

Cantilever 24 is oriented such that tip 26 above sample 16 is pointed to the surface of sample 16. The sample surface is brought into contact with tip 26 by means of course adjustment 22 and by actuating piezo-electrical scanner 20 in the z-direction. The term "bringing into contact" shall be understood such that the distance between tip 26 and the surface of sample 16 is set to be so small that both elements are in the range of short-range atomic interaction between the atoms of tip 26 and the atoms of sample 16. Such interactions occur in a distance ranging between about 1 and 10 Ångstrom.

Housing 18 is provided with an opening at the position where cantilever 24 is attached to allow a simple exchange of sample 16 and/or cantilever 24.

Housing 18 is provided with a laser diode 30 at the vertical position of upper mirror 12. Laser diode 30 is directed such that a beam 31 of laser light emitted therefrom is focussed on the free end of cantilever 24. A four-quadrant diode 32 acting as a position sensitive detector and having four segments is attached to housing 18 at a position opposite laser diode 30. Further, four-quadrant diode 32 may be displaced along the x-and the y-direction by means of a micrometer adjustment 33.

Instead of laser diode 30 and four-quadrant diode 32 other optical means may be used as an alternative, for example an optical interferometer. Further, it is possible to detect deflections of cantilever 24 by detecting the variation of electrical resistance of cantilever 24 itself.

Sample 16 and tip 26 of cantilever 24 are surrounded by a superconducting coil (not shown), generating a constant homogeneous magnetic field $B_0$ at the position of tip 26 and being directed in the z-direction as shown by arrows in FIG. 2.

A modulation coil (also not shown) superimposes constant magnetic field $B_0$ with a modulating magnetic field $B_{MOD}$ being parallel to magnetic field $B_0$ and having a frequency in the range of between 10 and 100 kHz with an amplitude of about $10^{-3}$ Tesla. The strength of constant magnetic field $B_0$ is selected to be preferably in the range of between 2 and 4 Tesla. The magnetic field strength must be set sufficiently high as will be explained further below.

Resonator 11 is provided with a microwave frequency magnetic field $B_1$ via a waveguide 36. Microwave magnetic field $B_1$ is fed into resonator 11 by means of an iris opening 38. Iris opening 38 may be varied by means of a matching screw 40 or the like for matching resonator 11. Microwave magnetic field $B_1$ is directed parallel to the plane of lower mirror 14 and perpendicular to the homogeneous static or constant magnetic field $B_0$ for exciting magnetic resonance, in particular electron paramagnetic resonance (EPR) within tip 26 and/or sample 16.

When the constant magnetic field $B_0$ is set to be 3,5 Tesla, the microwave frequency magnetic field $B_1$ must have a frequency of about 94 GHz for exciting EPR of spins having a gyromagnetic ratio g of about 2.

If the distance between upper mirror 12 and lower mirror 14 is 35 mm, a standing wave of about 10 wavelengths is generated within resonator 11 at a frequency of 94 GHz of microwave magnetic field $B_1$. Microwave magnetic field $B_1$ is exactly focussed on sample 16 and tip 26, respectively. By doing so disrupting effects from housing 18 are minimized.

Further, another coil to may be provided within housing 18 for generating an additional high-frequency magnetic field $B_2$ in the MHz-range within resonator 11 parallel to microwave frequency magnetic field $B_1$, for additionally exciting a nuclear magnetic resonance (NMR) within sample 16. For doing so a frequency of high-frequency magnetic field $B_2$ in the order of 140 MHz is required for exciting NMR of protons in the homogeneous constant magnetic field $B_0$ of 3,5 Tesla field strength.

Figure 3:
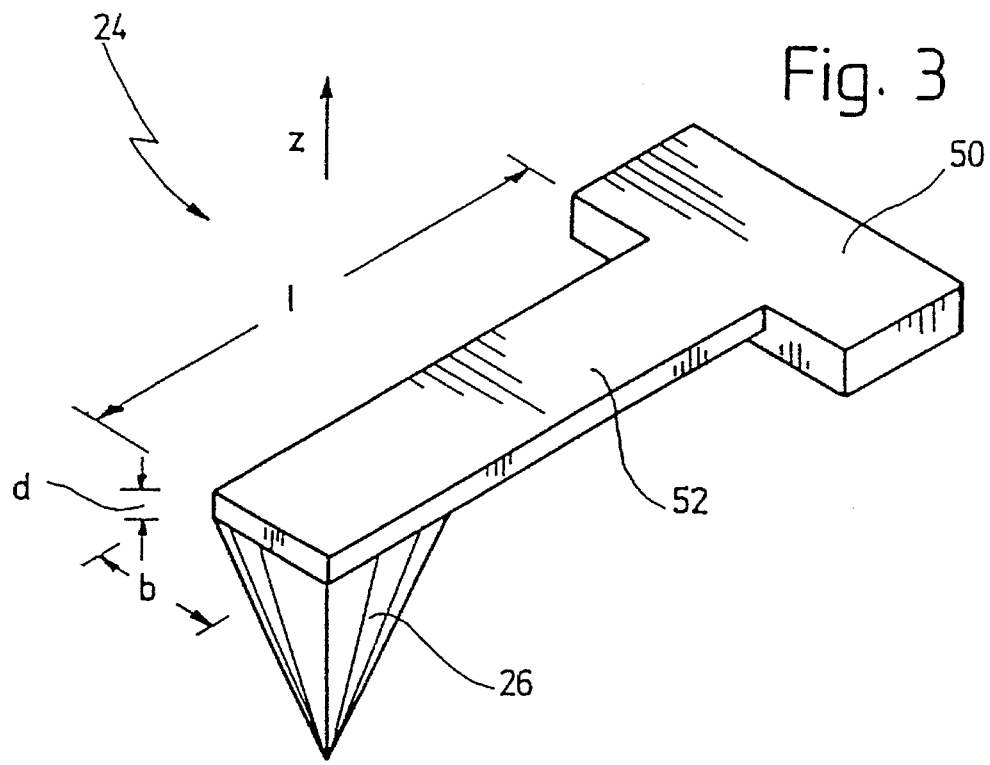
FIG. 3 is a perspective view, on an enlarged scale, of a cantilever used in the probe head of FIG. 2.

FIG. 3 shows in enlarged scale an essential element of the method and apparatus according to the present invention, namely the cantilever 24 being provided with tip 26.

Cantilever 24 consists of a base plate 50. Base plate 50 rigidly connects cantilever 24 with housing 18 via piezoelectrical modulator 27. Base plate 50 integrally extends as a free arm 52 of length 1 (typically 0.1 to 1 mm) and thickness d (preferably less than 20 82 m, typically 1 μm or even less). The terminal end of arm 52 may be deflected under the action of a positive or negative, respectively, force being directed in the z-direction, however, arm 52 is twisted under forces acting on the tip 26 in directions perpendicular to the z-direction.

The force sensibility of cantilever 24 is determined by its length 1 and the spring constant of arm 52. If cantilever 24 is used as a force-sensitive sensor for an oscillating force, the relevant parameters are its resonance frequency and its damping time from which its quality factor may be derived.

Modern technology cantilevers are manufactured from silicon single crystals and have resonance frequencies in the order of between 10 and 100 kHz with quality factors of above 10.000. They are able to detect forces down to $10^{-18}$ N.

Arm 52 is provided at its free end with preferably pyramid-shaped pointed tip 26. Tip 26 has a paramagnetic material end.

The paramagnetic material at the terminal end of tip 26 may be selected from a wide variety of materials. The only condition that the present invention requires is that at the very end of tip 26 (as close as possible to its material end) an unpaired spin has to be found, weakly coupled to the rest of tip 26, and accessible for EPR excitations. This does not necessarily mean that the material of tip 26 as a whole has to be paramagnetic.

Si tips to the best of present knowledge have a dangling bond on their terminal end (cf. the Manassen article, cited above and showing the existence of a dangling bond on an oxidized Si surface).

Further possibilities to manufacture a paramagnetic tip would include:

materials which are ferromagnetic or antiferromagnetic as a bulk material for tip 26. The tip as a whole will display a broad ferromagnetic or antiferromagnetic resonance, however, the atoms at the terminal end of the tip would display EPR at fields practically shifted outside of the broad, bulk resonance;

a few paramagnetic atoms like Eu, Gd, etc. can be placed at the terminal end of a prefabricated tip by electron beam deposition.

The free terminal end of tip 26 has a dimension in the Ångstrom scale, i.e. the dimension of a single atom. Such tips may be manufactured with modern technologies and are in use in the field of AFM (atomic force microscopy). Principally, any material with covalent bonding character may be used as the required paramagnetic material. As such, semiconductors or isolators may be used, such as silicon nitride ($Si_3N_4$). With the described method tip 26 is preferably selected as a material having different microscopic magnetic properties as compared with the material of sample 16, for what concerns the excitation of EPR.

In contrast to the AFM technology the present invention takes advantage of the fact that the outermost terminal end of tip 26 has a so-called "dangling bond" or defect, i.e. a free bonding electron. The existance of such a defect may be assumed for a pointed tip of the order of 1 Ångstrom. Such an electron which does not take part in a bonding has an unpaired spin and, together with its orbital angular momentum has a single paramagnetic moment which does not interact with other moments in the tip.

For avoiding a compensation of the free bonding by adsorbed radicals (e.g. oxygen) resonator 11 is subjected to a low-pressure atmosphere of an inert gas, for example helium.

Figure 4:
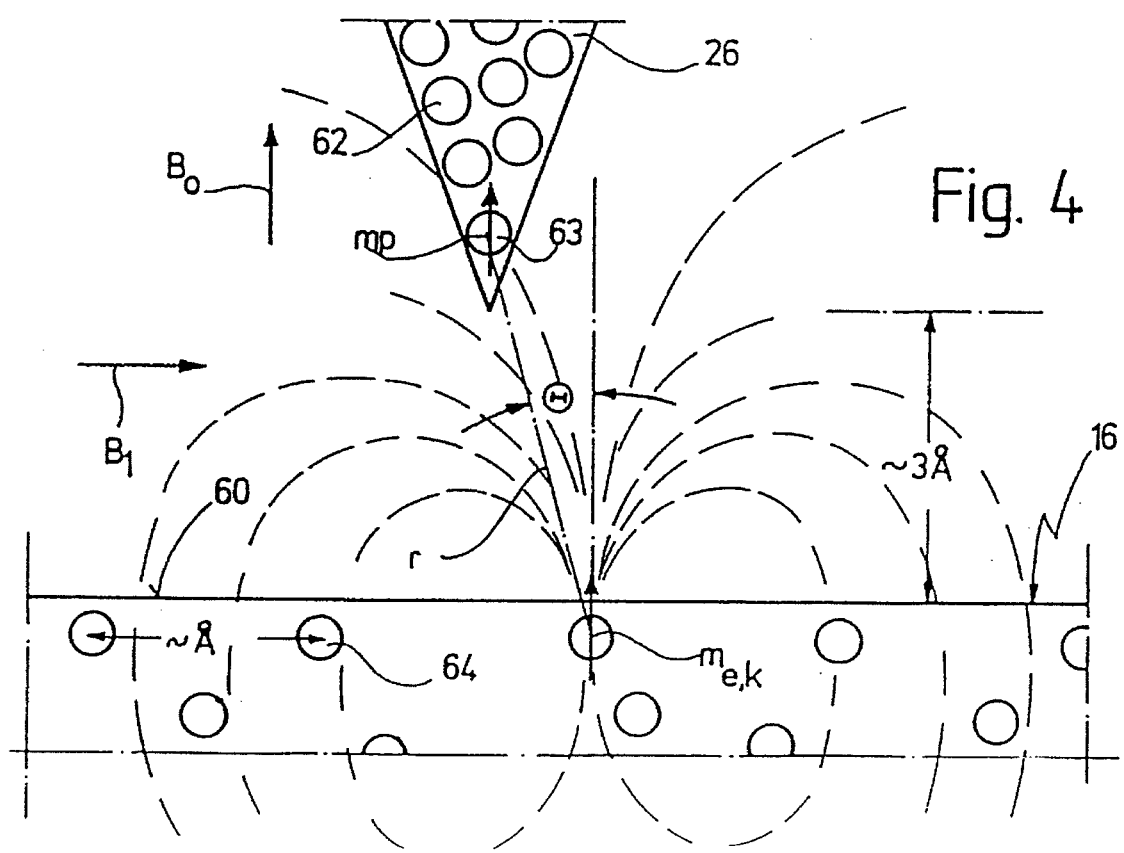
FIG. 4 is a schematical diagram showing the physical processes underlying the invention.

FIG. 4 illustrates the physical principles on which the invention is based. Tip 26 is directed to the surface 60 of sample 16. Tip 26 and sample 16 are located within the static homogeneous magnetic field $B_0$ being generated within resonator 11 by the superconducting coil. The z-axis of coordinate system 21 is directed parallel to $B_0$, as mentioned before. Atoms 62 are schematically shown in tip 26. Only atom 63 being located at the outermost terminal end of tip 26 has a free electronic paramagnetic moment $m_p$. Of course, also a nuclear magnetic moment caused by a nuclear spin could be taken into account and the following considerations would be the same mutatis mutandis.

It should be mentioned here that the term "moment" should be understood to be the expectation value of such a moment within the meaning of quantum mechanics.

Within sample 16 an uppermost layer of atoms 64 and, representative for all, an atomic magnetic moment $m_{e,k}$ is shown which could be an electronic moment or a nuclear moment or the sum of both.

Within the strong homogeneous static magnetic field $B_0$ of e.g. 3,5 Tesla strength, the magnetic moments $m_p$ and $m_{e,k}$ are oriented parallel to magnetic field $B_0$. For electrons $m_e = 9,27 \times 10^{-24}$ $Am^2$ and for protons $m_k = 1,41 \times 10^{-26}$ $Am^2$. Each of the magnetic moments $m_{e,k}$ in its surrounding and in the vicinity of surface 60 of sample 16 generates a local, inhomogeneous magnetic dipole field $B_{loc}$, the field lines of which are shown in FIG. 3 in dashed lines for representative moment $m_{e,k}$.

At the location of paramagnetic moment $m_p$ of tip 26 the component of the field intensity of magnetic dipole field $B_{loc}$ in the direction of static magnetic field $B_0$ is given by equation $$B_{loc} = \frac{\mu_0 m_{e,k}}{4\pi r^3} (3\cos^2 \Theta - 1) \tag{1}$$

Within equation (1) $\mu_0$ is the vaccum permeability. $\theta$ is the angle between the z-axis and the interconnecting line between point-shaped magnetic moment $m_{e,k}$ and the paramagnetic moment $m_p$. r is the distance between magnetic moments $m_p$ and $m_{e,k}$.

Paramagnetic moment $m_p$ views the strongest magnetic dipole field when moments $m_p$ and $m_{e,k}$ are located directly above each other ($\theta=0$). If sample 16 is displaced within the x-y-plane below tip 26, paramagnetic moment $m_p$ according to the distribution of the magnetic moments $m_{e,k}$ within sample 16 in the neighborhood of surface 60 is located alternately within areas of increasing and decreasing strength, respectively, of magnetic dipole field $B_{loc}$.

Due to the inhomogeneity of magnetic dipole field $B_{loc}$ a force acts on paramagnetic moment $m_p$ and, hence, on tip 26 of cantilever 24 according to the equation $$\vec{F} = (\vec{m_p} \cdot \vec{v}) \vec{B} \tag{2}$$

wherein, in particular, the force directed in z-direction $$F_z = m_p \frac{\partial}{\partial z} B_{loc} \tag{3}$$

is of interest because it deflects cantilever 24.

Table 1 shows the force $F_z$ on paramagnetic moment $m_p$ according to equation (3) for various distances between magnetic moments $m_e$ of an electron or $m_k$ of a proton, respectively, as are present within surface 60, and paramagnetic moment $m_p$ of tip 26 for an angle $\theta=0$ as well as the field strength of magnetic dipole field $B_{loc}$ according to equation (1) as well as the strength of gradient $B'_{loc}=\delta B_{loc}\delta_z$ of field strength $B_{loc}$.

From the values shown in Table 1 it can be particularly seen that due to the strong descrease of inhomogeneous dipole field $B_{loc}$ as a function of the distance between paramagnetic moment $m_p$ or tip 26 and the magnetic moments $m_{e,k}$ only the paramagnetic moment $m_p$ being closest to the outermost terminal end of tip 26 is sensitive for the magnetic force.

The same applies for neighbored moments $m_{e,k}$ of sample 16 having a distance of the order of a few Ångstrom from each other so that superposition effects through neighbored moments $m_{e,k}$ are negligible.

TABLE 1

| Distance r [Å] | $m_e$ | | | $m_k$ | | |
|---|---|---|---|---|---|---|
| | $B_{loc}$ [Gauss] | $B'_{loc}$ [Gauss/Å] | $F_z$ [N] | $B_{loc}$ [Gauss] | $B'_{loc}$ [Gauss/Å] | $F_z$ [N] |
| 1 | 18557 | $5,6 \cdot 10^4$ | $5,2 \cdot 10^{-13}$ | 28,2 | 84,7 | $8 \cdot 10^{-15}$ |
| 3 | 687,3 | 687,3 | $6,4 \cdot 10^{-15}$ | 1,04 | 1,04 | $9,7 \cdot 10^{-18}$ |
| 10 | 18,6 | 5,6 | $5,2 \cdot 10^{-17}$ | 0,028 | 0,008 | $8 \cdot 10^{-20}$ |

Force $F_z$ acting on tip 26 of cantilever 24 may be detected as a deflection of arm 52 from its initial position.

Therefore, according to the method of the present invention force $F_z$ is derived from the gradient of local inhomogeneous magnetic dipole field $B_{loc}$ of magnetic moments $m_{e,k}$ within the vicinity of surface 60 of sample 16. Due to the fact that with such a detection method the resolution that may be obtained is inversely proportional to the gradient of local inhomogeneous magnetic dipole field $B_{loc}$, magnetic structures within sample 16 may be resolved within the Ångstrom-range due to the extremely high gradients (cf. Table 1) when the claimed detection method is used.

The strength of homogeneous static magnetic field $B_0$ has to be selected such that it is higher as compared to the strength of inhomogeneous magnetic dipole field $B_{loc}$ in the vicinity of surface 60 of sample 16 for ensuring that magnetic moments $m_p$ and $m_{e,k}$ are properly oriented. With a field strength of e.g. $B_0=3,5$ Tesla this is certainly the case.

Up to now only the generation of a static force was discussed as acting on tip 26 and resulting in a deflection of arm 52 of cantilever 24 to one side only. However, preferably an oscillating force instead of a static force is measured with cantilever 24, thereby yielding an amplification of the measurement effect, provided that the frequency of the oscillating force is the same as the resonant frequency or natural frequency of cantilever 24.

EPR is excited in tip 26 by irradiating microwave magnetic field $B_1$ orthogonally to homogeneous static magnetic field $B_0$. When a static magnetic field $B_0$ of 3,5 Tesla strength is used, the resonance condition for EPR in the paramagnetic material of tip 26 is fulfilled at a frequency of microwave magnetic field $B_1$ of about 94 GHz. The exact position of the resonance line within the EPR spectrum depends on the superimposed inhomogeneous dipole field $B_{loc}$ caused by the magnetic moments $m_{e,k}$ of sample 16 at the location of tip 26.

If EPR is excited periodically, an oscillating force, in particular with the resonance frequency of cantilever 24 may be generated, as will be described in connection with the following embodiments of the invention, by inverting the paramagnetic moment $m_p$ at tip 26 through a modulation of the EPR with the resonance frequency of cantilever 24. In particular, it shall be discussed how the oscillating force may be detected.

Force detection modes suitable for carrying out the present invention would comprise DC and AC detection modes, however, for sensitivity reasons, AC detection modes are contemplated better.

The AC detection operates by creating means to modulate the force and detects the derivative of the force with the aid of a lock-in amplifier (J. A. Sidles et al., "Signal-to-noise ratios in electrical and mechanical detection of magnetic resonance", Phys. Rev. Lett. 70, 3506–3509, (1993)).

Using an AFM, one observes static forces, therefore, to implement this type of detection, one has to add an active means to modulate the sample-tip distance. This is the function of the piezoelectric modulator placed below the probe (cf. reference numeral 28 in FIG. 2). Moving periodically the tip in a range within the forces acting on it are changing, the resonance frequency of the cantilever will change proportionally with the space derivative of the force acting on the tip. Two types of AC detection modes may be used, namely amplitude modulated (AM) and frequency modulated (FM) detection.

In the AM mode the cantilever is driven to oscillate at a constant frequency by applying constant amplitude oscillating voltage on the piezoelectric modulator. The amplitude variation of the oscillating cantilever is monitored with a lock-in amplifier under the influence of the forces. The largest amplitude oscillation is created by setting the drive voltage frequency to be equal to the mechanical resonance frequency of the cantilever. As the force derivative appears as a resonant frequency change, the highest sensitivity achieved (the largest amplitude variation) when the driving frequency is set off resonance by an amount of the half width of the mechanical resonance.

In the FM mode the high quality factor cantilever is literally used as the frequency-determining element of an oscillator, just as the quartz piece is used in a common quartz oscillator. The electronics driving the piezoelectric modulator monitors the oscillator component of the photodiode signals, and maintains it to be constant in amplitude. The frequency variation of the signal of the cantilever is then measured, which is directly related to the force gradient experienced by the tip.

Within the scope of the present invention, the suggested example configurations use the combinations of these detection modes. The magnetic force component being the component of interest, is a minority component. The magnetic resonance means are disposed of to modulate it, calling for the use of ac detection. The examples shown in FIGS. 5 and 6 use an AM mode AC detection, but this is not the signal which controls the tip-sample distance. The DC part of the signal is used to set and control the working point or working distance of the tip. The magnetic force is modulated by periodically alternating the direction of the tip-spin. Therefore, there is no need to drive the cantilever oscillation with the piezoelectric modulator, since it will be driven by the magnetic force. It is the amplitude of the cantilever oscillation which is detected synchronously with the force modulation. Tuning the force modulation (EPR excitation) frequency to the mechanical resonance frequency of the cantilever results in a sensitive narrow band receiver, i.e. a sensitivity increase by the Q factor of the mechanical resonance. All other forces present, usually investigated by AFM, are static forces while the present invention provides means to make the magnetic force time dependent.

Further, before turning to the block diagrams of FIGS. 5 to 8, various spin manipulation means should be discussed, as are suitable for carrying out the present invention.

The classics of the magnetic resonance literature offer many possibilities to achieve a periodical modulation (inversion) of the spin orientation in an external static field of high enough magnetic field strength. They can be grouped in three categories, speaking in terms of the underlying physical phenomena.

1. The adiabatic inversion corresponds to an adiabatic demagnetization in the rotating frame. Applying a continuous wave excitation and passing slowly through the resonance will invert the expectation value of $m_z$, if the variation is slow compared to the Larmor frequency in the rotating frame. This can be realized in two equivalent ways:

applying a constant frequency CW millimeter-wave ($B_1$) or RF for the sample spin ($B_2$), while sweeping the static field $B_0$ through resonance;

keeping the static field constant and sweeping the frequency of the CW millimeter-wave (or RF for the sample-spin) through resonance.

A periodic repetition of any of the above two procedures, i.e. a large amplitude modulation of $B_0$ an FM modulation of $B_1$ and/or $B_2$ will result in a periodic inversion of the spin.

2. Transient nutation means staying close to resonance and applying a long pulse resulting in nutation of the spin, i.e. an oscillation of $m_z$ with the period of about the Larmor frequency in the rotating frame. The difficulty of this technique is that the frequency of the oscillation will vary as the resonance condition will vary while the tip is moving. The advantage of this technique is that the variation of the frequency can be used to measure the field at the position of the tip-spin.

3. Finally, a third spin manipulation means would comprise pulsing at a periodical rate. If the value of $B_1$ allows, quick inversions can be produced by $\pi$ (180°) pulses without precisely tracking the resonance condition. To avoid the accumulation of rotation angle errors, in practice one will need to use more complicated pulse sequences (a phase alternation of the pulses, at least) than a simple repetition of identical $\pi$ pulses.

The afore-mentioned three spin manipulation possibilities can be applied both as a primary excitation on the tip-spin and as a secondary excitation on the sample-spin in combination with any of the different force detection modes, raising the possible number of operation modes under the present invention for the apparatus difficult to count.

Figure 6:
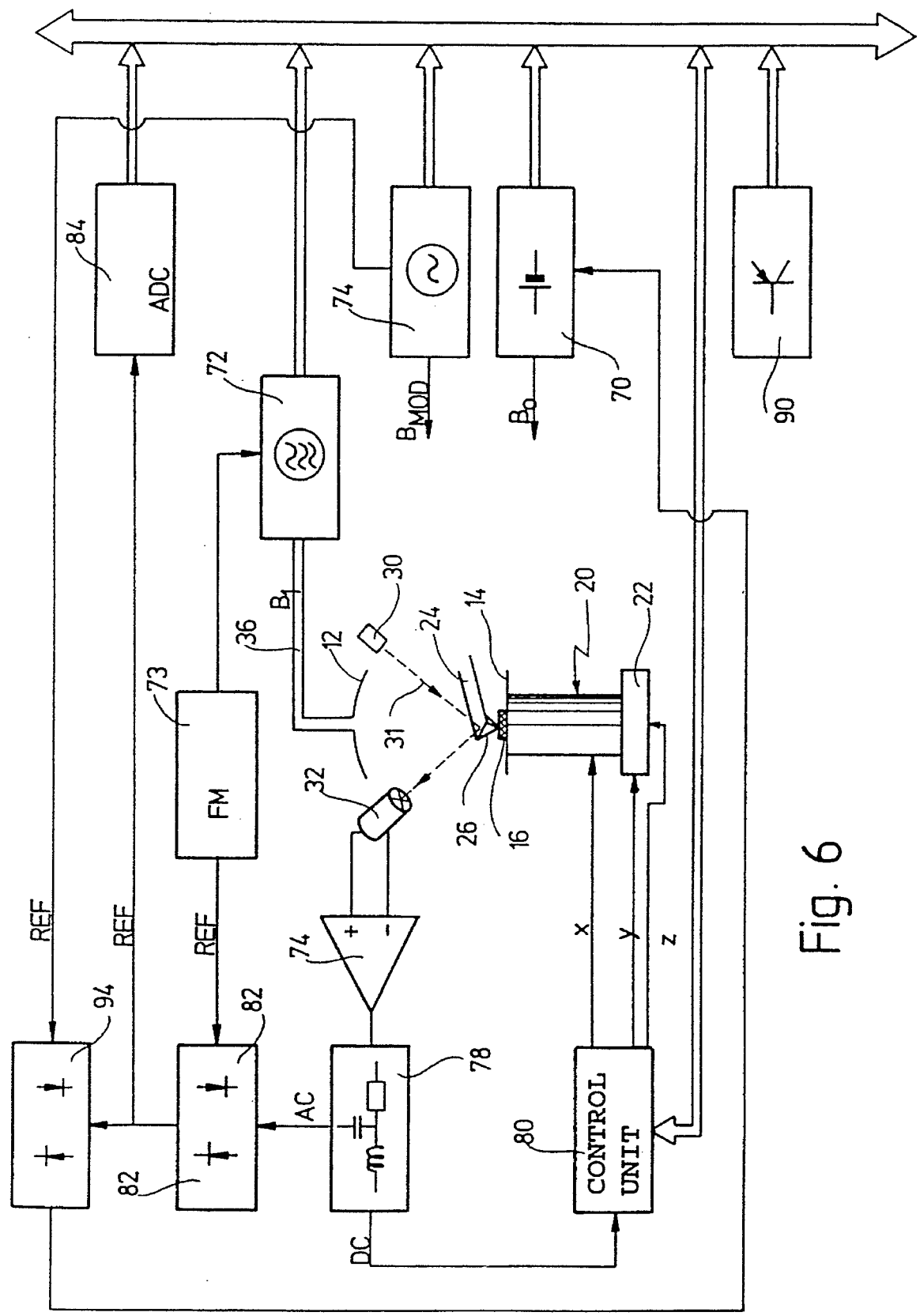
FIG. 6 is a block diagram of a second embodiment of an apparatus according to the present invention.
Figure 7:
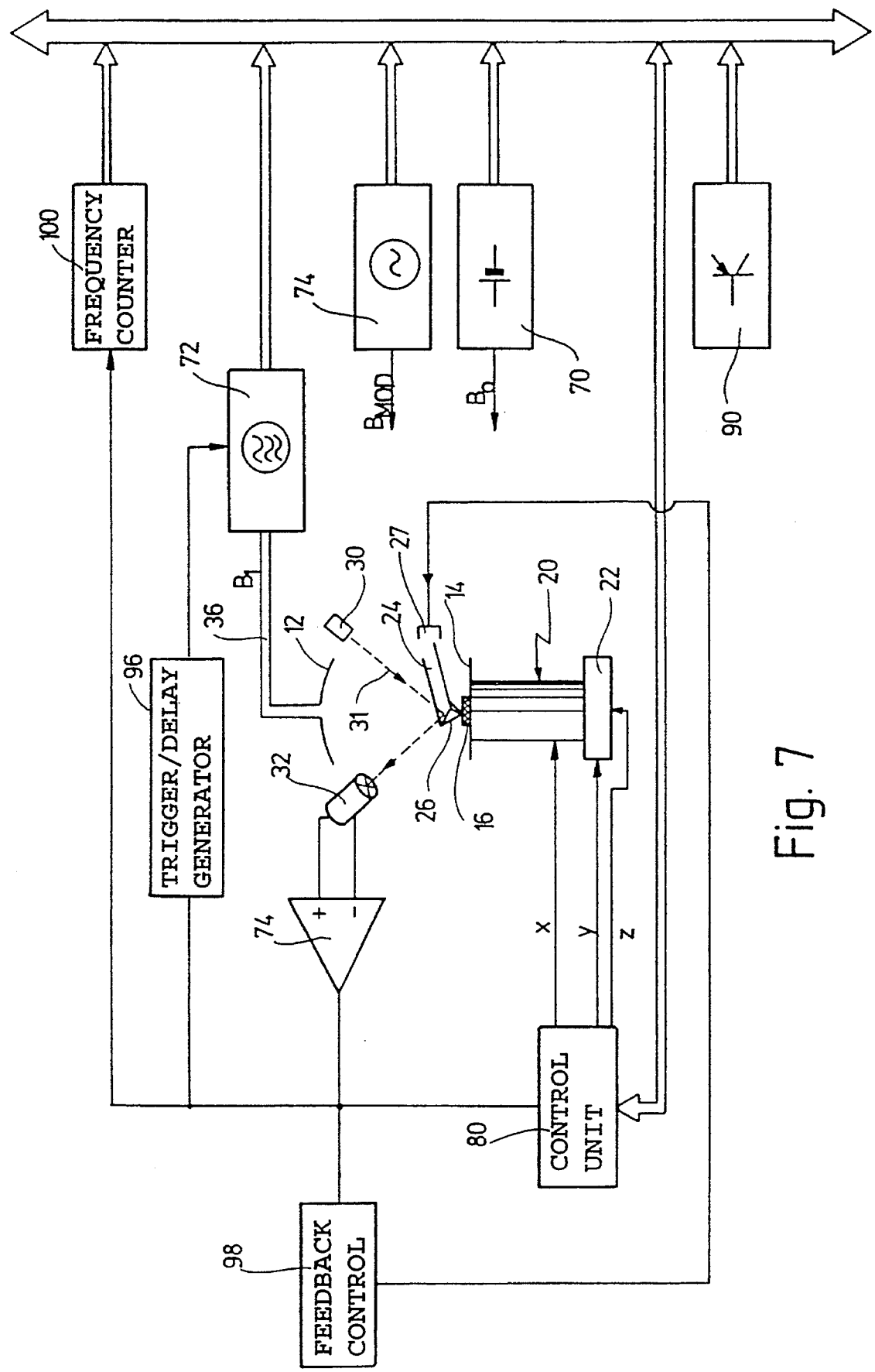
FIG. 7 is a block diagram of a third embodiment of an apparatus according to the present invention.

The operation mode examples given on the block diagrams deal only with the primary excitations and use the two possibilities offered by adiabatic inversion (FIG. 5 for the field modulation, FIG. 6 the FM modulation) and the simplest variant of the pulsing method (FIG. 7).

These physically different means represent different advantages and they will be useful under different conditions and will perform differently in terms of required measuring time and information provided. For selecting one of the three spin manipulation means, the following should be borne in mind:

The adiabatic inversion method is the most straight forward, and the easiest example to show, how one can combine the modulated excitation and the detected signal through a lock-in amplifier to achieve the selective detection of the magnetic force. It is also the simplest configuration (FIG. 5) to search for a signal, i.e. for resonance field. The FM case is included as a separate example to show a possibility of field tracking. Both examples use AM mode force detection, but nothing prevents the use of this excitation modes in connection with any other force detection mode. This is the most natural choice for secondary excitations, i.e. frequencies swept continuous RF excitation, as well.

The transient nutation method has no reference signal coherent with the excitation frequency. It requires a real time, high resolution digitization of the cantilever signal, and a subsequent Fourier analysis to single out the oscillating component. The measured amplitude is proportional to the force. The measured frequency contains information about the variation of the off-resonance field. If signal-to-noise allows, this technique has the advantage to measure simultaneously and continuously the force and the field variation at the same time without adjustment of $B_0$. This is an AM-like force detection mode, that is the nutation frequency has to match the cantilever resonance frequency and band width.

The pulsing method is used in connection with the FM force detection as shown in FIG. 7. It is the easiest to realize externally triggered, but it is equally suited to AM force detection. If the spectral coverage of pulses are sufficient, it will allow for force measurement without worrying about field adjustment.

Figure 5:
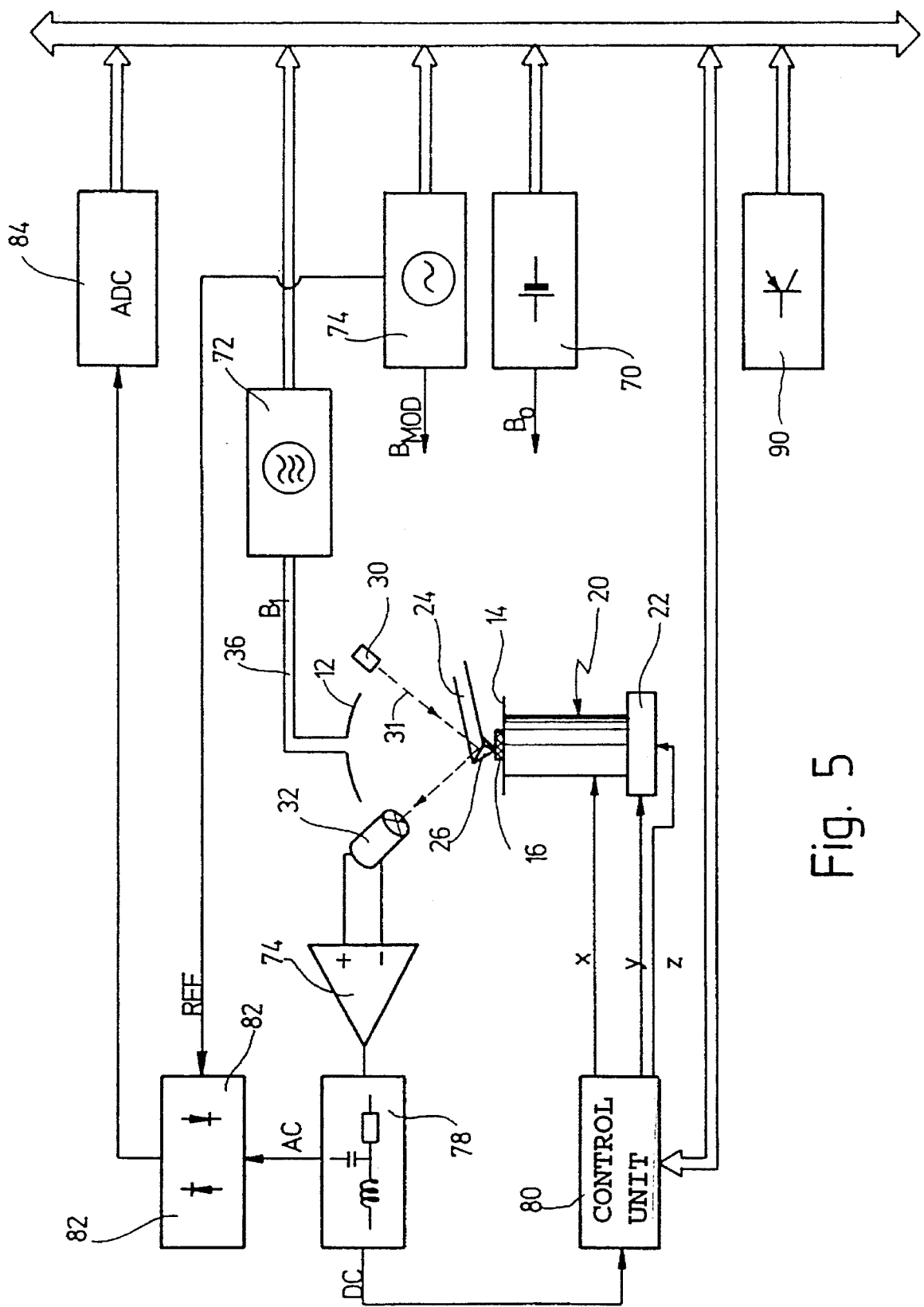
FIG. 5 is a block diagram of a first embodiment of an apparatus according to the invention.

FIG. 5 shows a block diagram of a first embodiment of an apparatus according to the invention enabling to carry out the method according to the invention.

First, sample 16 is brought into contact, i.e. into atomic interaction with tip 26 of cantilever 24 by means of piezoelectrical scanner 20.

A power supply 70 is provided for feeding a superconducting coil (not shown) generating the strong homogeneous magnetic field $B_0$ along the z-direction in the area of resonator 11. A source of microwave frequency 72 generates the microwave frequency magnetic field $B_1$ being fed to resonator 11 via waveguide 36 in continuous wave operation. Within resonator 11 magnetic fields $B_0$ and $B_1$ are oriented orthogonally to each other. The microwave frequency magnetic field $B_1$ is irradiated with a fixed frequency and the homogeneous static magnetic field $B_0$ is set such that EPR is excited only within the paramagnetic material of tip 26. In contrast, no EPR is excited within sample 16 at this time because the paramagnetic material of tip 26 has a different gyromagnetic ratio as compared to that of the sample material.

A low-frequency generator 74 generates a modulation field $B_{MOD}$ of weak amplitude and parallel to magnetic field $B_0$ within resonator 11 via a modulation coil (not shown). The modulation frequency lies in the range of between 10 and 100 kHz and is selected to be equal to the resonance frequency of cantilever 24. The modulation of homogeneous static magnetic field $B_0$ around the EPR resonance line causes a periodical inversion of paramagnetic moment $m_p$ within tip 26 of cantilever 24 at the modulation frequency. Hence, an oscillating force $f_z$ of same frequency acts on tip 26 being proportional to the gradient of inhomogeneous magnetic dipole field $B_{loc}$ caused by sample 16. As a result cantilever 24 is excited to oscillate in z-direction with a frequency being equal to the frequency of modulating field $B_{MOD}$.

Light beam 31 emitted by laser diode 30 is reflected by the free end of cantilever 24 and then impinges on four-quadrant diode 32 for being detected therein. Four-quadrant diode 32 is oriented such that the currents within its four segments are equal when cantilever 24 is in its neutral position.

As soon as cantilever 24 is deflected, e.g. downwardly in the z-direction, the current within the lower segment increases and within the upper segment decreases. A differential amplifier 76 is switched behind four-quadrant diode 32 for generating a differential signal of the upper and the lower segment of four-quadrant diode 32. The output signal of differential amplifier 26 has an alternating current (AC) component caused by the above-described oscillation of cantilever 24 and has a direct current (DC) component caused by the deflection of cantilever 24 due to static atomic non-magnetic forces acting on tip 26 of cantilever 24 if tip 26 is at a distant of a few Ångstroms from the surface 60 of sample 16. Such non-magnetic forces are e.g. the attracting van-der-Waals force or the repelling force of the electron envelope.

The AC portion and the DC portion of the output of differential amplifier 26 are separated in a AC/DC decoupler 78. The DC portion of the output signal of AC/DC decoupler 78 is fed to a control unit 80 for piezo-electrical scanner 20, initiating a computer-controlled adjustment of the distance between tip 26 and sample 16, wherein for every point (x,y) of sample surface 60 the distance is set such that the sum of the static atomic non-magnetic forces on tip 26 is constant. The obtained values for distance z as a function of x and y are stored and are the basis for the generation of a topographical atomic structure picture of surface 60 of sample 16 as may be obtained with an atomic force microscope.

The AC portion of the output signal of AC/DC decoupler 78 is synchronously detected in a lock-in amplifier 82 with a reference signal from low-frequency generator 74. By doing so a fine tuning of the modulation frequency on the resonance frequency of cantilever 24 may be obtained. The measured signal is digitized in an analog/digital converter 84.

By means of piezo-electrical scanner 20 sample 16 is displaced below tip 26 of cantilever 24 in directions parallel to surface 60 of sample 16 wherein in predetermined points, preferably in all of the points x, y of surface 60 of sample 16 the amplitude of oscillation of cantilever 24 is detected being a measure for the intensity of the gradient of the inhomogeneous magnetic dipole field $B_{loc}$ along the surface 60 of sample 16 and, hence, a measure for the atomic magnetic structure of surface 60 of sample 16.

The digitized measured signal is fed to a computer 90 providing the entire control of the apparatus and the processing of the measured values.

FIG. 6 shows a block diagram of a second embodiment being slightly modified as compared to the first embodiment of FIG. 5. Within the source of microwave energy 72 the microwave signal and, hence, the microwave frequency magnetic field $B_1$ is frequency modulated with a FM-frequency and is then fed to resonator 11. The quality factor of resonator 11 allows a frequency modulation of e.g. up to 50 MHz. By frequency modulating the microwave frequency magnetic field $B_1$ an oscillating force is generated.

The measured signal, i.e. the AC component of AC/DC decoupler 78 is initially fed to a first lock-in amplifier 82 of the present embodiment and is synchronously detected with the FM signal of the source of microwave frequency 72 as a reference signal and is then evaluated via analog/digital converter 84.

A low-frequency magnetic field $B_{MOD}$ generated by low-frequency generator 74 and amplitude modulating the homogeneous static magnetic field $B_0$ is used in this embodiment for tuning magnetic field $B_0$ in order for precisely controlling EPR. The amplitude modulation frequency is much smaller as compared to the resonance frequency of cantilever 24 and is typically in the order of 100 Hz. For doing so an output signal of first lock-in amplifier 82 is synchronously detected in a second lock-in amplifier 94 with a reference signal from low-frequency generator 74. The output signal of second lock-in amplifier 94 is used as an error signal for adjusting static magnetic field $B_0$.

FIG. 7 shows a third embodiment in which the magnetic force is detected in a different manner as compared to that described before.

Cantilever 24 is excited by piezo-electric modulator 27 to oscillate at resonance with constant amplitude. The inversion of paramagnetic moment $m_p$ of tip 26 is effected by irradiating the microwave frequency magnetic field $B_1$ as a sequence of π-pulses (180°-pulses) which are generated by the source of microwave energy 72 in a gated mode of operation. The π-pulses are set with their repetition rate to be synchronous to the resonance frequency or natural frequency of tip 26 by means of a trigger/delay generator 96. For example a π-pulse may be irradiated into resonator 11 at every zero transition of the oscillating output signal of differential amplifier 76.

Care should be taken that the homogeneous static magnetic field $B_0$ is kept exactly on the EPR resonance line which is not that easy because tip 26 due to its oscillation views a modulated inhomogeneous magnetic field $B_{loc}$ from the dipoles within surface 60 in a z-direction.

When sample 16 is displaced below tip 26 in x- and y-directions, i.e. when tip 26 travels through the gradient of inhomogeneous magnetic field $B_{loc}$ caused by the magnetic moments $m_{e,k}$ of sample 16, then a steady variation of the resonance frequency of cantilever 24 may be detected. For, the resonance frequency of cantilever 24 is proportional to the gradient of the force due to the inhomogeneous magnetic field $B_{loc}$ in the vicinity of surface 60 of sample 16. This effect is explained in more detail in an article of Sidler et al. (Phys. Rev. Lett. 70, p. 3506 (1993)).

The variation of the resonance frequency of cantilever 24 is detected by a frequency counter 100.

A feedback control 98 feeds the measured signal back to piezo-electric modulator 27 to keep the oscillation amplitude constant.

Up to now it was discussed how the inhomogeneous magnetic field $B_{loc}$ caused by magnetic moments $m_{e,k}$ within sample 16 in the vicinity of surface 60 may be detected. It has not been taken into account, insofar, whether the moments were pure electron or nuclear magnetic moment or the sum of both.

Independently of which of the embodiments of the method according to the present invention, described before, in addition to the microwave frequency magnetic field $B_1$ an additional high-frequency magnetic field $B_2$ may be irradiated into resonator 11 by means of coil to (FIG. 2) for additionally exciting an NMR within sample 16. In such a so-called electron-nuclear-double-resonance set-up (ENDOR) the frequency of additional high-frequency magnetic field $B_2$ is swept through the NMR line, the NMR being detected as a decrease of the magnetic force on tip 26 of cantilever 24. In such a way the magnetic moments $m_{e,k}$ may be measured quantitatively.

The same applies, mutatis mutandis, when an electron magnetic moment shall be detected. For that purpose an electron-electron-double-resonance set-up (ELDOR) is used and, instead of an additional ratio-frequency magnetic field a second microwave frequency magnetic field is irradiated in addition to the standard microwave frequency magnetic field $B_1$ as $B_2$.

According to the method and the apparatus of the present invention one can, therefore, generate a conventional topographic picture of the surface 60 of sample 16 by using the apparatus like a conventional atomic force microscope.

However, by taking advantage of the magnetic resonance within tip 26 of cantilever 24 the gradient of the inhomogeneous magnetic field $B_{loc}$, caused by the various electron and nuclear moments, may be measured via the action of a force.

Furthermore, it is possible to combine the detection of magnetic forces with conventional ENDOR and ELDOR concepts, respectively, for identifying the atoms with respect to their magnetic moments and their relative position with respect to each other.

Figure 8:
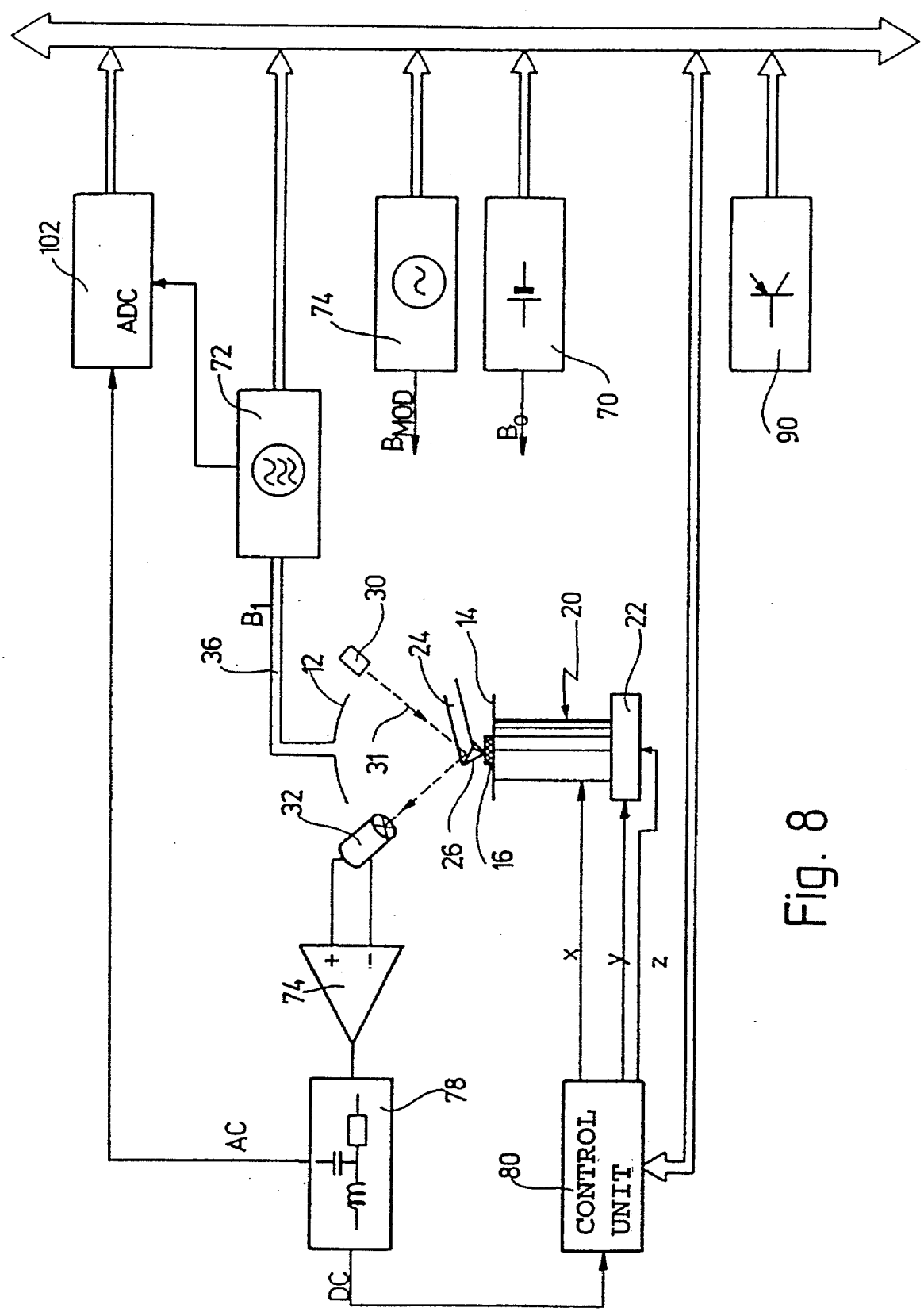
FIG. 8 is a block diagram of a fourth embodiment of an apparatus according to the present invention.

FIG. 8, finally, shows another block diagram to illustrate the use of transient nutation.

In contrast to the above-described block diagrams, a trigger output of source 72 of microwave energy is used to trigger a fast digitizer 102 receiving its input signals from AC/DC decoupler 78.

We claim:

1. A method for detecting an atomic structure of a sample along a surface thereof, said method comprising the steps of:

arranging said sample in a constant magnetic field ($B_0$) of predetermined field strength and high homogeneity, said constant magnetic field ($B_0$) having a first direction;

irradiating a first high-frequency magnetic field ($B_1$) of a first predetermined frequency on said sample, said first high-frequency magnetic field ($B_1$) having a second direction perpendicular to said first direction;

providing a force-sensitive sensor having a paramagnetic tip comprising a paramagnetic spin at a terminal end of said paramagnetic tip, said spin being accessible for electron paramagnetic resonance (EPR) excitation;

placing said sensor in close vicinity to said sample such that said sensor tip is in atomic interaction with said sample surface;

setting said predetermined field strength and said first predetermined frequency such that EPR is excited within said paramagnetic tip;

displacing said paramagnetic tip parallel to said sample surface for mapping predetermined points on said sample surface; and during said step of displacing measuring a force exerted on said paramagnetic tip by a local inhomogeneous magnetic field ($B_{loc}$) caused by atomic magnetic moments ($m_{e,k}$) of said sample.

2. The method of claim 1, comprising the further steps of:

irradiating a second high-frequency magnetic field ($B_2$) of a second predetermined frequency on said sample, said second high-frequency magnetic field ($B_2$) having a second direction perpendicular to said first direction, and setting said second predetermined frequency such that magnetic resonance is excited within said sample surface.

3. The method of claim 2, wherein said step of exciting magnetic resonance comprises exciting nuclear magnetic resonance (NMR).

4. The method of claim 2, wherein said step of exciting magnetic resonance comprises exciting EPR.

5. The method of claim 1, wherein said constant magnetic field ($B_0$) is set to be stronger than said inhomogeneous magnetic field ($B_{loc}$) created by said sample and said spin.

6. The method of claim 1, wherein a cantilever is used as said force-sensitive sensor.

7. The method of claim 1, wherein said constant magnetic field ($B_0$) is selected in the range above 2 Tesla.

8. The method of claim 7, wherein said constant magnetic field $B_0$ is selected to be in the range between 2 and 4 Tesla.

9. The method of claim 1, wherein said constant magnetic field ($B_0$) is set to extend perpendicularly to said sample surface.

10. The method of claim 1, wherein said paramagnetic tip is designed with a terminal end having an isolated paramagnetic moment ($m_p$).

11. The method of claim 1, wherein said paramagnetic material of the tip is selected different from the material constituting said sample.

12. The method of claim 1, wherein said paramagnetic tip is placed at a distance of between 1 and 10 Å from said sample surface.

13. The method of claim 1, wherein said force exerted on said paramagnetic tip causes a deflection thereof, said deflection being measured by optical means.

14. The method of claim 13, wherein a laser beam is reflected on said force sensitive sensor to impinge on a four-quadrant diode means, said deflection being measured as a difference signal between an upper segment and a lower segment of said four-quadrant diode means.

15. The method of claim 1, wherein said force exerted on said paramagnetic tip causes a deflection thereof, said deflection being measured via a change of electrical resistance of said force-sensitive sensor itself.

16. The method of claim 1, wherein said constant magnetic field ($B_0$) is adapted to be amplitude modulated with a modulation frequency in the range of between 10 and 100 kHz.

17. The method of claim 1, wherein said high-frequency magnetic field ($B_1$) is frequency modulated with a modulation frequency in the range of between 10 and 100 kHz.

18. The method of claim 1, wherein maintaining EPR conditions is controlled by means of low-frequency modulating said constant magnetic field ($B_0$).

19. The method of claim 16, wherein said modulation frequency is set to be equal to a natural frequency of said force-sensitive sensor.

20. The method of claim 17, wherein said modulation frequency is set to be equal to a natural frequency of said force-sensitive sensor.

21. The method of claim 17, wherein a measuring signal having said modulation frequency of said frequency modulated high-frequency magnetic field ($B_1$) is synchronously detected in a first lock-in amplifier, a reference signal having said low-frequency modulation frequency of said constant magnetic field ($B_0$) being synchronously detected in a second lock-in amplifier with an output signal of said first locking amplifier as a reference signal, said second lock-in amplifier having an output signal being processed as an error signal for fine adjusting said constant magnetic field ($B_0$) and, thereby, EPR resonance conditions.

22. The method of claim 1, wherein said force-sensitive sensor is mechanically exited to oscillate at its natural frequency, said first high-frequency magnetic field being irradiated as a sequence of pulses synchronous with said sensor oscillations, a variation of said sensor natural frequency being detected along said sample surface.

23. The method of claim 1, wherein for distinguishing between nuclear moments and paramagnetic moments within said sample, further, additional high-frequency magnetic fields ($B_{RF}$) are irradiated on said sample parallel to said high-frequency field ($B_1$) for exciting nuclear magnetic resonance (NMR).

24. The method of claim 1, wherein said tip of said force-sensitive sensor is brought into interaction with said sample surface such that the sum of static atomic non-magnetic forces acting on said tip equals zero.

25. The method of claim 24, wherein a laser beam is reflected on said force sensitive sensor to impinge on a four-quadrant diode means, and wherein a distance between said tip of said force-sensitive sensor and said sample surface at which said sum of static atomic non-magnetic forces equals zero is set and controlled by means of a DC signal from said four-quadrant diode means.

26. An apparatus for detecting an atomic structure of a sample along a surface thereof, said apparatus comprising:
   means for arranging said sample in a constant magnetic field ($B_0$) of predetermined field strength and high homogeneity, said constant magnetic field ($B_0$) having a first direction;
   first means for irradiating a first high-frequency magnetic field ($B_1$) of a first predetermined frequency on said sample, said first high-frequency magnetic field ($B_1$) having a second direction perpendicular to said first direction;
   means for providing a force-sensitive sensor having a paramagnetic tip comprising a paramagnetic spin at a terminal end of said paramagnetic tip, said spin being accessible for electron paramagnetic resonance, (EPR) excitation;
   means for placing said sensor in close vicinity to said sample such that said sensor tip is in atomic interaction with said sample surface;
   means for setting said predetermined field strength and said first predetermined frequency such that EPR is excited within said paramagnetic material;
   means for displacing said paramagnetic tip parallel to said sample surface for mapping predetermined points on said sample surface; and
   means for measuring the force exerted on said paramagnetic tip by a local inhomogeneous magnetic field ($B_{loc}$) caused by atomic magnetic moments ($m_{e,k}$) of said sample during said step of displacing.

27. The apparatus of claim 26, wherein said paramagnetic tip comprises a terminal end having an isolated paramagnetic moment ($m_p$).

28. The apparatus of claim 26, wherein said placing means And said displacing means comprise a piezo-electrical scanner.

29. The apparatus of claim 26, wherein said measuring means comprise optical elements for detecting a deflection of said force-sensitive sensor.

30. The apparatus of claim 29, wherein said optical elements comprise a source of laser light having a laser diode and, further, comprise a four-quadrant diode as a detector.

31. The apparatus of claim 29, wherein said optical elements comprise an interferometer.

32. The apparatus of claim 26, wherein said placing means, said displacing means and said measuring means are all attached to a housing enclosing said first means for irradiating a first high-frequency magnetic field.

33. The apparatus of claim 26, wherein said arranging means comprise a poor supply and a superconducting magnet coil.

34. The apparatus of claim 26, wherein said first means for irradiating a first high-frequency magnetic field ($B_1$) comprise a source of microwave energy, a resonator and a waveguide.

35. The apparatus of claim 34, wherein said resonator is a Fabry-Perot resonator.

36. The apparatus of claim 34, wherein said source of microwave energy generates said first high-frequency magnetic field ($B_1$) in a continuous wave mode of operation.

37. The apparatus of claim 34, wherein a frequency modulation generator is provided for frequency modulating said first high-frequency magnetic field ($B_1$) generated by said source of microwave energy.

38. The apparatus of claim 34, wherein a low-frequency generator and an additional coil are provided for generating a modulating magnetic field ($B_{MOD}$) being parallel to and modulating said constant magnetic field ($B_0$) within said resonator.

39. The apparatus of claim 30, wherein a differential amplifier is switched behind said four-quadrant diode.

40. The apparatus of claim 39, wherein an AC/DC decoupler is switched behind said differential amplifier.

41. The apparatus of claim 40, wherein said first means for irradiating a first high-frequency magnetic field ($B_1$) comprises a source of microwave energy and a resonator, and wherein a low-frequency generator is provided, for causing modulation of said constant magnetic field ($B_0$) within said resonator, and wherein lock-in amplifiers are provided for synchronously detecting an AC output signal from said AC/DC decoupler with reference signals from said low-frequency generator.

42. The apparatus of claim 40, wherein said placing means and said displacing means comprise a piezo-electrical scanner, and wherein said AC/DC decoupler are cooperatively connected.

43. The apparatus of claim 41, wherein an A/D converter is provided for digitizing an output signal from one of said lock-in amplifiers.

44. The apparatus of claim 32, wherein a piezo-electrical modulator is arranged between said force-sensitive sensor and said housing.

45. The apparatus of claim 39, wherein a frequency counter is switched to an output of said differential amplifier.

46. The apparatus of claim 39, wherein first means for irradiating comprise a source of microwave energy and wherein a trigger/delay generator is arranged between an output of said differential amplifier and said source of microwave energy.

47. The apparatus of claim 26, wherein further means are provided for generating third high-frequency magnetic fields ($B_{RF}$) parallel to said first high-frequency magnetic field ($B_1$) for exciting a nuclear magnetic resonance (NMR) within said sample.

48. The apparatus of claim 28, wherein means are providing for controlling said piezo-electrical scanner.

49. The apparatus of claim 34, wherein said resonator is subjected to an inert gas atmosphere.

50. The apparatus of claim 26, wherein a computer is provided for controlling the apparatus and for processing measured data.

51. The method of claim 17, wherein maintaining EPR conditions is controlled by means of low-frequency modulating said constant magnetic field ($B_0$) and wherein a measuring signal having said modulation frequency of said high-frequency magnetic field ($B_1$) is synchronously detected in a first lock-in amplifier, and a reference signal having said low-frequency modulation of said constant magnetic field ($B_0$) is synchronously detected in a second lock-in amplifier with an output signal of said first lock-in amplifier being used as a reference signal, said second lock-in amplifier having an output signal that is processed as an error signal for fine adjusting said constant magnetic field ($B_0$) and, thereby, EPR resonance conditions.

52. The method of claim 24, wherein a laser beam is reflected on said force sensitive sensor to impinge on a four-quadrant diode means and wherein a distance between said tip of said force-sensitive sensor and said sample surface at which said sum of static atomic non-magnetic forces equals zero is set and controlled by means of a DC signal from said four-quadrant diode means.

53. The apparatus of claim 26, wherein, further, second means are provided for irradiating a second high-frequency magnetic field ($B_2$) of a second predetermined frequency on said sample, said second high-frequency magnetic field ($B_2$) having a second direction perpendicular to said first direction, and setting said second predetermined frequency such that magnetic resonance is excited within said sample surface.

54. The method of claim 1, wherein for distinguishing between nuclear moments and paramagnetic moments within said sample, further, additional high-frequency magnetic fields ($B_{RF}$) are irradiated on said sample parallel to said high-frequency field ($B_1$) for exciting further paramagnetic resonance (EPR).

55. The apparatus of claim 34, wherein said source of microwave energy generates said first high frequency magnetic field ($B_1$) in a gated mode of operation.

56. The apparatus of claim 40, wherein said first means for irradiating a first high-frequency magnetic field ($B_1$) comprises a source of microwave energy, and wherein a frequency modulation generator is provided for frequency modulating said first high-frequency magnetic field ($B_1$) generated by said source of microwave energy and, wherein lock-in amplifiers are provided for synchronously detecting an AC output signal from said AC/DC decoupler with reference signals from said frequency modulating generator.

57. The apparatus of claim 26, wherein further means are provided for generating additional high-frequency magnetic field ($B_{RF}$) parallel to said first high-frequency magnetic field ($B_1$) for exciting further electron paramagnetic resonance (EPR) within said sample.

* * * * *